US011515058B2

(12) United States Patent
Chen et al.

(10) Patent No.: US 11,515,058 B2
(45) Date of Patent: Nov. 29, 2022

(54) CONDUCTIVE FILM, PRODUCTION METHOD THEREOF, AND DISPLAY APPARATUS

(71) Applicants: Hefei BOE Display Technology Co., Ltd., Anhui (CN); Beijing BOE Technology Development Co., Ltd., Beijing (CN)

(72) Inventors: Hao Chen, Beijing (CN); Wei Zhang, Beijing (CN); Xiaotong Zhang, Beijing (CN)

(73) Assignees: Hefei BOE Display Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 618 days.

(21) Appl. No.: 16/484,599

(22) PCT Filed: Feb. 27, 2019

(86) PCT No.: PCT/CN2019/076329
§ 371 (c)(1),
(2) Date: Aug. 8, 2019

(87) PCT Pub. No.: WO2019/227990
PCT Pub. Date: Dec. 5, 2019

(65) Prior Publication Data
US 2020/0381137 A1     Dec. 3, 2020

(30) Foreign Application Priority Data

May 30, 2018   (CN) .......................... 201810544773.4

(51) Int. Cl.
*H01B 1/22*   (2006.01)
*B05D 7/04*   (2006.01)
(Continued)

(52) U.S. Cl.
CPC ................. *H01B 1/22* (2013.01); *B05D 7/04* (2013.01); *C08K 3/08* (2013.01); *C08L 1/04* (2013.01);
(Continued)

(58) Field of Classification Search
CPC ......................................................... H01B 1/22
See application file for complete search history.

(56) References Cited

U.S. PATENT DOCUMENTS 8,018,563 B2   9/2011   Jones et al.
10,244,637 B2  3/2019   Jones et al.
(Continued)

FOREIGN PATENT DOCUMENTS

CN   102264766 A   11/2011
CN   103360616 A   10/2013
(Continued)

OTHER PUBLICATIONS

Third Office Action, including Search Report, for Chinese Patent Application No. 201810544773.4, dated Aug. 14, 2020, 18 pages.
(Continued)

*Primary Examiner* — William D Young
(74) *Attorney, Agent, or Firm* — Westman, Champlin & Koehler, P.A.

(57) ABSTRACT

There is provided a conductive film, a production method thereof, and a display apparatus. The conductive film comprises: nanometal as a filling material; and oxidized nanocellulose as a matrix material. The nanometal/oxidized nanocellulose composite conductive film may be used in flexible display.

13 Claims, 2 Drawing Sheets

(51) Int. Cl.
*C08K 3/08* (2006.01)
*C08L 1/04* (2006.01)
*H01L 27/12* (2006.01)
*H01L 29/43* (2006.01)
*B82Y 30/00* (2011.01)
*B82Y 40/00* (2011.01)

(52) U.S. Cl.
CPC .............. *H01L 27/12* (2013.01); *H01L 29/43* (2013.01); *B05D 2201/02* (2013.01); *B05D 2518/00* (2013.01); *B82Y 30/00* (2013.01); *B82Y 40/00* (2013.01); *C08K 2003/085* (2013.01); *C08K 2003/0806* (2013.01); *C08K 2003/0831* (2013.01); *C08K 2201/001* (2013.01); *C08K 2201/011* (2013.01); *C08L 2203/16* (2013.01); *C08L 2312/00* (2013.01)

(56) References Cited

U.S. PATENT DOCUMENTS

| | | |
|---|---|---|
| 2008/0259262 A1 | 10/2008 | Jones et al. |
| 2009/0321364 A1 | 12/2009 | Spaid et al. |
| 2012/0000392 A1 | 1/2012 | Mukai et al. |
| 2012/0033367 A1 | 2/2012 | Jones et al. |
| 2016/0148715 A1* | 5/2016 | Wu .................. H01B 1/124 428/375 |
| 2019/0131368 A1 | 5/2019 | Zhang et al. |
| 2019/0191569 A1 | 6/2019 | Jones et al. |

FOREIGN PATENT DOCUMENTS

| | | |
|---|---|---|
| CN | 103777417 A | 5/2014 |
| CN | 107658333 A | 2/2018 |
| CN | 108717944 A | 10/2018 |
| JP | 2017-157339 A | 9/2017 |

OTHER PUBLICATIONS

Zhang, Huaiyu et al., "Use of chitosan to reinforce transparent conductive cellulose nanopaper", Journal of Materials Chemistry C, Royal Society of Chemistry, Published on Nov. 29, 2017, Downloaded by State Intellectual Property Office of P.R.C. on Apr. 1, 2019, 8:32:59 AM, 7 pages.

First Office Action, including Search Report, for Chinese Patent Application No. 201810544773.4, dated Jun. 25, 2019, 16 pages.

* cited by examiner

CONDUCTIVE FILM, PRODUCTION METHOD THEREOF, AND DISPLAY APPARATUS

CROSS-REFERENCE TO RELATED APPLICATION

This application is a Section 371 National Phase of International Application No, PCT/CN2019/076329, filed on 27 Feb. 2019, which has not yet published, and claims priority to Chinese Patent Application No. 201810544773.4 filed on May 30, 2018, the contents of which are incorporated herein in by reference.

TECHNICAL FIELD

This disclosure relates to the field of display. Particularly, this disclosure relates to a conductive film, a production method thereof, and a display apparatus.

BACKGROUND ART

As electronic products are developed in a trend of being lighter and being foldable, flexible transparent conductive films based on flexible base substrates have broad application prospects in the field of flexible display. Transparent flexible conductive films, which are much researched and used at present, are classified into oxide-based films, metal-based films, polymer-based films, and the like, according to their conductive layers. A flexible transparent conductive film not only requires a high light transmittance, a good thermal stability, and a good conductive property, but also requires bendability and a certain mechanical strength.

SUMMARY OF THE INVENTION

In one aspect, this disclosure provides a conductive film, comprising:
 a film matrix formed from oxidized nanocellulose, and nanometal filled in the film matrix.
 In one embodiment of this disclosure, the nanometal is uniformly dispersed in the film matrix.
 In another embodiment of this disclosure, the film matrix is crosslinked oxidized nanocellulose.
 In another embodiment of this disclosure, the film matrix is oxidized nanocellulose crosslinked with bivalent or trivalent metal ions.
 In another embodiment of this disclosure, the bivalent or trivalent metal ions are selected from at least one of calcium ions, magnesium ions, aluminum ions, and trivalent iron ions.
 In another embodiment of this disclosure, the nanometal is selected from at least one of nanosilver, nanocopper, and nanogold.
 In another embodiment of this disclosure, the nanometal is selected from at least one of a nanometal particle and a nanometal wire.
 In another embodiment of this disclosure, the nanometal particle has a particle diameter of 10 to 20 nm.
 In another embodiment of this disclosure, the nanometal wire has a diameter of 10 to 20 nm and a length of 100 to 200 nm.
 In another embodiment of this disclosure, a weight ratio of the nanometal to the oxidized nanocellulose is 10:100 to 200:100.

In another embodiment of this disclosure, the oxidized nanocellulose has an aspect ratio of 200 to 2000 and a diameter of 1 to 10 nm.
 In another embodiment of this disclosure, the conductive film has a thickness of 5 to 50 μm.
 In another aspect, this disclosure provides a method of producing a conductive film of any one described above, comprising:
 mixing a dispersion of nanometal and a dispersion of oxidized nanocellulose to obtain a mixture,
 coating the mixture on a base substrate, and
 drying the mixture coated on the base substrate to obtain the conductive film.
 In one embodiment of this disclosure, the method further comprises: after the step of drying, immersing the conductive film in a solution of bivalent or trivalent metal ions to substitute at least a part of sodium ions in the oxidized nanocellulose with the bivalent or trivalent metal ions.
 In one embodiment of this disclosure, the base substrate is a polyethylene terephthalate or polymethyl methacrylate base substrate.
 In still another aspect, this disclosure provides a display apparatus, comprising a conductive film of any one described above.
 In one embodiment of this disclosure, the conductive film is at least one of a cathode, an anode, a source electrode, a drain electrode, and a gate electrode.
 In another embodiment of this disclosure, the display apparatus further comprises a polyethylene terephthalate or polymethyl methacrylate base substrate in direct contact with the conductive film.

DESCRIPTION OF DRAWINGS

In order to illustrate the technical solutions in Examples of this disclosure more clearly, figures required for describing the Examples will be simply introduced below. It is apparent that the figures described below are merely exemplary Examples of this disclosure, and other figures may be further obtained by those of ordinary skill in the art according to these figures without exerting inventive work.

DESCRIPTION OF EMBODIMENTS

Figure 1:
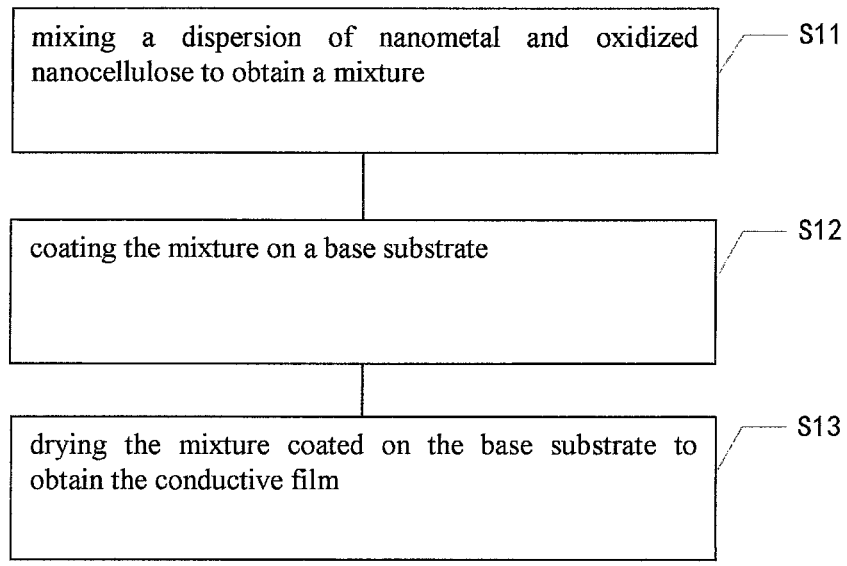
FIG. 1 is a diagram which exemplarily illustrates process steps of producing a conductive film according to a specific embodiment of this disclosure.

The technical solutions in the Examples of this disclosure will be described clearly and fully below in conjunction with specific embodiments of this disclosure. Obviously, the embodiments and/or Examples described are merely a part of the embodiments and/or Examples of this disclosure, rather than all of the embodiments and/or Examples. Based on the embodiments and/or Examples of this disclosure, all other embodiments and/or Examples obtained by those of ordinary skill in the art without performing inventive work belong to the scope protected by this disclosure.

In this disclosure, the layer and the film may be interchangeably used, unless specifically indicated. In this disclosure, all characteristics of numeric values mean to be within an error range of measurement, for example within ±10%, within ±5%, or within ±1% of a defined numeric value.

Flexible transparent conductive films have broad application prospects in the field of flexible display. Transparent flexible conductive films are classified into oxide-based films, metal-based films, polymer-based films, and the like according to their conductive layers.

Oxide-based conductive films are mature in applications on TFT-LCDs. For example, a flexible transparent conductive film may be produced by depositing an oxide-based conductive film as a conductive layer on a base such as polyethylene terephthalate, polymethyl methacrylate, or the like. However, these oxide-based conductive materials will easily fall off due to the problem of thermal expansion. Additionally, in the production process of oxide-based conductive materials, high-precision processes and facilities such as evaporation, sputtering, and the like are often used, and special gases are further required. Therefore, with respect to this kind of material, the process is complicated, the cost is high, and it is not environmentally friendly. It is difficult for metal-based conductive films to meet increasing requirements for electronic products in light transmittance due to relatively low light transmittance thereof. As indicated by the results of a more recent research on silver thin films, the light transmittance thereof is only about 80%. The polymer-based conductive film has a good light transmittance but has a bad temperature tolerance and a bad chemical stability, and thereby the properties of other structures are influenced. The polymer-based conductive film also has a bad conductivity, which is to be further improved.

As research and development of techniques of transparent conductive materials, people begin to study composite conductive materials, for example composite conductive films having sandwich structures, such as dielectric/metal/dielectric, oxide/metal/oxide, and the like. Although the conductive property has been greatly improved, the problems of complicated production process and high cost cannot be solved. With some novel conductive films employing new materials such as carbon nanotubes, graphene, and the like, there are still problems of environmental pollution, low film forming continuity, low uniformity, low yield, and the like.

Therefore, it is still desirable to provide an environment-friendly conductive film having a good light transmittance, a good heat resistance, a good conductivity, a production method thereof, and a display apparatus comprising the conductive film.

Cellulose is a macromolecular polysaccharide composed of glucose and is the main component of cell walls of plants. Cellulose is a polysaccharide having the widest distribution and the most content in nature, and occupies 50% or more of the carbon content in plants. At normal temperature, cellulose is soluble neither in water nor typical organic solvents, such as alcohol, ethyl ether, acetone, benzene, and the like. It is not soluble in dilute alkaline solutions, either. Therefore, it is relatively stable at normal temperature due to the presence of hydrogen bonds between cellulose molecules. Cellulose is soluble in a cuprammonia ($Cu(NH_3)_4(OH)_2$) solution, a cupriethylenediamine [$NH_2CH_2CH_2NH_2$]$Cu(OH)_2$ solution, and the like.

Cellulose and an oxidizing agent are subjected to chemical reaction to generate a series of substances having different structures from that of the original cellulose. This process of reaction is referred to as cellulose oxidation, and oxidized cellulose is obtained.

Through intensive and detailed studies, the inventor of this disclosure has found that A nanometal/oxidized nanocellulose composite conductive film has a good light transmittance (higher than about 90%) and a good heat resistance (which may be up to 400° C.), and may be used in flexible display. Furthermore, the oxidized nanocellulose is derived from lignin of plants in nature, and has a low cost and an environment-friendly production process, complying with the idea of sustainable development. Therefore, the nanometal/oxidized nanocellulose composite conductive film is a biomass-based conductive film.

Therefore, in an aspect of this disclosure, there may be provided a conductive film, comprising:
  a film matrix formed from oxidized nanocellulose, and
  nanometal filled in the film matrix.

In other words, the conductive film may comprise:
  nanometal as a filling material; and
  oxidized nanocellulose as a matrix material.

That is, this disclosure provides a nanometal/oxidized nanocellulose composite conductive film. The oxidized nanocellulose forms the main body of the film, i.e., a film matrix. The nanometal is filled in the film matrix, preferably uniformly dispersed in the film matrix.

In the nanometal/oxidized nanocellulose composite conductive film, nanometal has a function of electrical conduction, and the oxidized nanocellulose is used as the backbone of the composite to allow nanometal particles to be uniformly dispersed therein. Furthermore, the thin film of oxidized nanocellulose itself has a good light transmittance (higher than about 90%), and the light transmittance of the entire conductive film may be improved.

In the nanometal/oxidized nanocellulose composite conductive film, the nanometal may be uniformly dispersed in the film matrix. By uniformly dispersing the nanometal in the film matrix, various physical and chemical properties of the conductive film may be allowed to be uniform in the entire thin film so as to improve the performance of display.

In the nanometal/oxidized nanocellulose composite conductive film, the film matrix may be crosslinked oxidized nanocellulose. By crosslinking treatment, the composite material is tighter and the heat resistance may be further improved, and the film forming continuity and the conductivity uniformity of the conductive film are ensured.

In the nanometal/oxidized nanocellulose composite conductive film, the oxidized nanocellulose may be oxidized nanocellulose crosslinked with bivalent or trivalent metal ions. The bivalent or trivalent metal ions are selected from at least one of calcium ions, magnesium ions, aluminum ions, and trivalent iron ions.

In the nanometal/oxidized nanocellulose composite conductive film, the nanometal may be selected from at least one of nanosilver, nanocopper, and nanogold.

In the nanometal/oxidized nanocellulose composite conductive film, the nanometal may be selected from at least one of a nanometal particle and a nanometal wire.

The nanometal particle may have a particle diameter of 10 to 20 nm.

The nanometal wire may have a diameter of 10 to 20 nm and a length of 100 to 200 nm.

In the nanometal/oxidized nanocellulose composite conductive film, The weight ratio of the nanometal to the oxidized nanocellulose is 10:100 to 200:100, for example 20:100 to 150:100, or 25:100 to 100:100. By allowing the ratio of them to be in this range, the requirements for conductivity, heat resistance, light transmittance, and film forming property may be satisfied simultaneously.

In the nanometal/oxidized nanocellulose composite conductive film, the oxidized nanocellulose may have an aspect ratio of 200 to 2000 and a diameter of 1 to 10 nm.

In the nanometal/oxidized nanocellulose composite conductive film, the conductive film may have a thickness of 5 to 50 μm.

In another aspect of this disclosure, there may be provided a method of producing a conductive film of any one described above. As shown in FIG. 1, the method comprises:

S11: mixing a dispersion of nanometal and oxidized nanocellulose to obtain a mixture, S12: coating the mixture on a base substrate, and S13: drying the mixture coated on the base substrate to obtain the conductive film.

The method may further comprise: after the step of drying, S13, immersing the conductive film in a solution of bivalent or trivalent metal ions to substitute at least a part of sodium ions in the oxidized nanocellulose with the bivalent or trivalent metal ions.

In the mixture obtained by mixing the dispersion of the nanometal and the oxidized nanocellulose, the nanometal and the oxidized nanocellulose are uniformly mixed, which may be performed by ultrasonic treatment.

Furthermore, the conductive film obtained by drying the mixture coated on the base substrate is located on the base substrate. The conductive film may be peeled from the base substrate, as needed. The step of immersing the conductive film in a solution of bivalent or trivalent metal ions may comprise immersing the unpeeled conductive film and the base substrate in a solution of bivalent or trivalent metal ions, or may comprise immersing the peeled conductive film in a solution of bivalent or trivalent metal ions.

The base substrate may be a polyethylene terephthalate or polymethyl methacrylate base substrate. The conductive film is in direct contact with the polyethylene terephthalate or polymethyl methacrylate base substrate. By using the polyethylene terephthalate or polymethyl methacrylate base substrate, the oxidized nanocellulose material and the base substrate exhibit a high affinity because they both contain oxygen-containing groups such as ester groups, and it is advantageous to the adhesion of the conductive film on the base substrate.

In still another aspect of this disclosure, there may be provided a display apparatus, comprising a conductive film of any one described above.

In the display apparatus, the conductive film may be at least one of a cathode, an anode, a source electrode, a drain electrode, and a gate electrode.

The display apparatus may further comprise a polyethylene terephthalate or polymethyl methacrylate base substrate in direct contact with the conductive film. By using the polyethylene terephthalate or polymethyl methacrylate base substrate, the oxidized nanocellulose material and the base substrate exhibit a high affinity because they both contain oxygen-containing groups such as ester groups, and it is advantageous to the adhesion of the conductive film on the base substrate.

Figure 2:
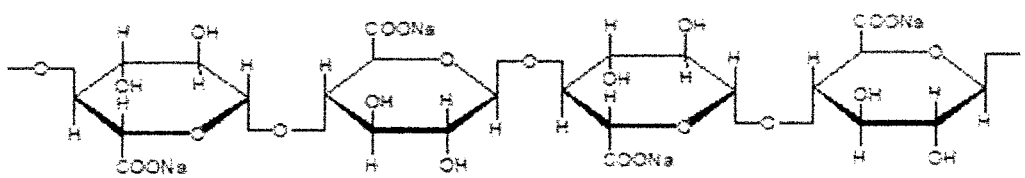
FIG. 2 is a structural formula which exemplarily illustrates a structural formula of a molecule of oxidized nanocellulose obtained according to an embodiment of this disclosure.

The oxidized nanocellulose may be obtained by oxidizing cellulose with a hypochlorite in the presence of an alkali metal bromide and tetramethylpiperidinyl-N-oxyl under a condition where pH is 9 to 10. The structural formula of the oxidized nanocellulose thus obtained is as shown in FIG. 2.

Illustrations are made below by exemplifying nanosilver particles as the nanometal, but this disclosure is not limited thereto. For example, the nanometal may also be at least one of nanocopper or nanogold. Furthermore, nanometal may also be a nanometal wire.

The dispersion of nanosilver particles may be obtained by reducing a soluble silver salt with an alkali metal borohydride in the presence of a surfactant in water under a basic condition.

Figure 3:
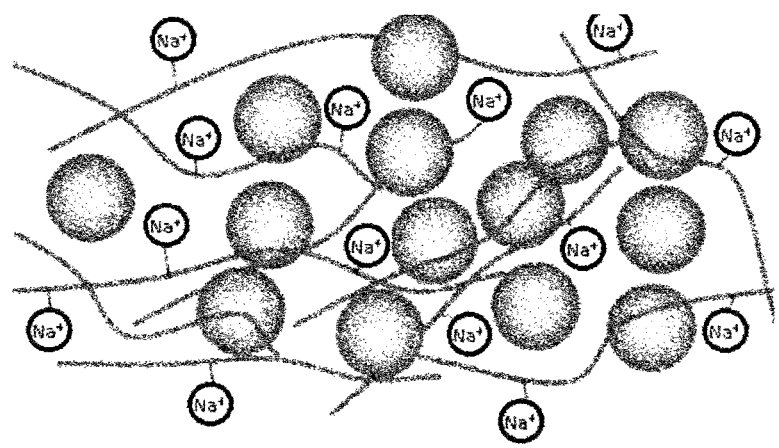
FIG. 3 is a structural schematic diagram which exemplarily illustrates that nanosilver is uniformly dispersed in a film matrix formed from oxidized nanocellulose according to a specific embodiment of this disclosure.

Therefore, the conductive film according to this disclosure may be a nanosilver/uncrosslinked oxidized nanocellulose composite conductive film, as shown in FIG. 3. As can be seen from FIG. 3, nanosilver particles are uniformly dispersed in uncrosslinked oxidized nanocellulose. In the uncrosslinked oxidized nanocellulose, the metal ion is a sodium ion.

Figure 4:
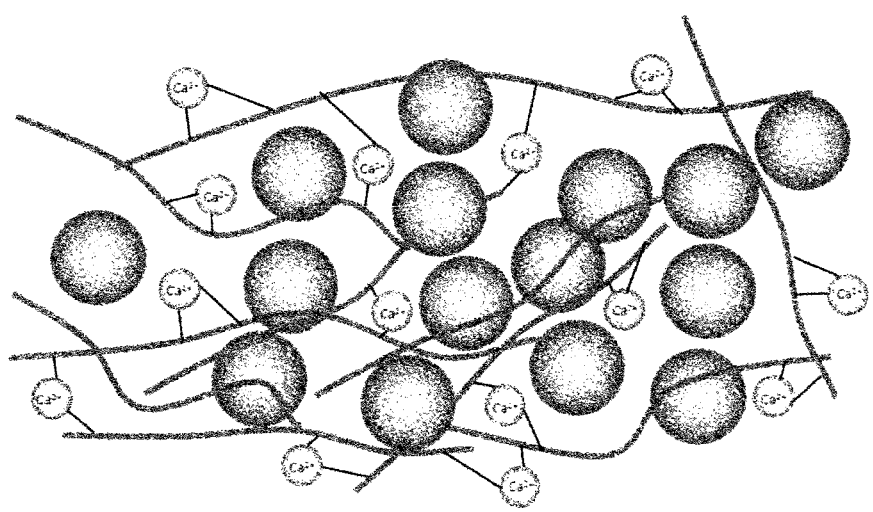
FIG. 4 is a structural schematic diagram which exemplarily illustrates that nanosilver is uniformly dispersed in crosslinked oxidized nanocellulose according to another specific embodiment of this disclosure.

Additionally, the conductive film according to this disclosure may also be a nanosilver/crosslinked oxidized nanocellulose composite conductive film, as shown in FIG. 4. As can be seen from FIG. 4, nanosilver particles are uniformly dispersed in crosslinked oxidized nanocellulose. In the uncrosslinked oxidized nanocellulose, at least a part of sodium ions are substituted with bivalent or trivalent metal ions. The crosslinked oxidized nanocellulose has a more compact structure and a stronger water-barrier and gas-barrier property, i.e., a stronger capability of preventing penetration of water and oxygen. Furthermore, it has an excellent high-temperature resistance. The addition of nanometal such as nanosilver enhances the speed of heat dissipation so that the heat resistance may be up to 400° C. Therefore, the requirements of electronic devices for thermal stability may be satisfied. After treatment with a crosslinking process, the material has further improved mechanical properties and a more excellent bending property, and has a relatively large potential in the field of flexible display devices.

An exemplary method of producing a nanosilver/oxidized nanocellulose composite conductive film is provided below.

Tetramethylpiperidinyl-N-oxyl (TEMPO) (a catalyst) and NaBr are added to deionized water and dissolved with stirring. Wet wood pulp (typically having a moisture content of 81%) is added. An appropriate amount of NaClO is further added to have a function of oxidation. pH=10 is then maintained with NaOH. After reaction for an appropriate period, filtration is performed. Unoxidized cellulose is then removed by ultrasonic dispersion in deionized water. A TEMPO-oxidized nanocellulose solution may be obtained after high-speed centrifugation.

$AgNO_3$ powder is dissolved in deionized water, and a surfactant, which is polyvinyl pyrrolidone (PVP), is added, to obtain a solution A with sufficient stirring. $NaBH_4$ and NaOH are dissolved in deionized water to obtain a solution B. With ultrasonic oscillation and homeothermic magnetic stirring, the solution A is dropped into the solution B. The constant temperature is controlled until reaction is finished, followed by washing and ultrasonic dispersion, to obtain an aqueous dispersion of nanosilver.

The TEMPO-oxidized nanocellulose solution and the aqueous dispersion of nanosilver are mixed at a certain ratio, and are coated on a flat base substrate after uniform ultrasonic dispersion. The moisture is air-dried to obtain a composite flexible transparent conductive film with nanosilver/oxidized nanocellulose uniformly dispersed.

EXAMPLES

Technical solutions of this disclosure will be further illustrated by specific Examples below. However, these Examples are merely for the purpose of illustrating this disclosure, and should not be construed as limiting this disclosure.

Example 1

Production of TEMPO-Oxidized Nanocellulose Solution 0.033 g of TEMPO and 0.33 g of NaBr were added to 100 g of deionized water and dissolved with stirring. 1.25 g of wet wood pulp (bleached softwood Kraft pulp, purchased from Nippon Paper Industries Co., Ltd.) having a moisture content of 81% was added. 0.5 g of an aqueous NaClO solution having a concentration of 3.8 mmol/g was then added to obtain a mixture. An aqueous NaOH solution having a concentration of 0.4 mol/L was then used to maintain the mixture at pH=10. After a 6 h period of reaction, filtration was performed with filter paper. The filtrate obtained on the filter paper was ultrasonically dispersed in deionized water. Unoxidized nanocellulose was subjected to centrifugation at 10000 rpm and then precipitates at the bottom of a centrifugation tube. A supernatant was obtained, which was a solution of TEMPO-oxidized nanocellulose having a mass fraction of TEMPO-oxidized nanocellulose being 0.1%.

Example 2

Aqueous Dispersion of Nanosilver 0.0136 g of $AgNO_3$ powder was dissolved in 40 mL of deionized water. 1.2 g of PVP was added with sufficient stirring to obtain a solution A. 0.05 g of $NaBH_4$ and 0.02 g of NaOH were dissolved in 100 mL of deionized water to obtain a solution B. With ultrasonic oscillation and homeothermic magnetic stirring, the solution A is dropped into the solution B. A constant temperature (70° C.) was controlled until reaction was finished (2 h), followed by washing and ultrasonic dispersion, to obtain an aqueous dispersion of nanosilver.

Example 3

Production of Conductive Film

The TEMPO-oxidized nanocellulose solution and the aqueous dispersion of nanosilver were mixed at a weight ratio of TEMPO-oxidized nanocellulose to nanosilver of 2:8, and were poured into a polydimethyl terephthalate dish after uniform ultrasonic dispersion, so that the dried conductive film had a thickness of 20 μm. By drying at 60° C., a composite flexible transparent conductive film with nanosilver/oxidized nanocellulose uniformly dispersed was obtained, which was the conductive film of Example 3.

Example 4

Production of Conductive Film

A conductive film of Example 4 was obtained in the same manner as that of Example 3, except that the weight ratio of TEMPO-oxidized nanocellulose to nanosilver was changed to 3:7.

Example 5

Production of Conductive Film

A conductive film on a base substrate was obtained in the same manner as that of Example 3, except that the weight ratio of TEMPO-oxidized nanocellulose to nanosilver was changed to 4:6.
The conductive film was peeled from the base substrate. The peeled conductive film was immersed in a calcium chloride solution having a concentration of 0.1 mol/L for a 2 h period to obtain a conductive film of Example 5.

Example 6

Production of Conductive Film

A conductive film of Example 6 was obtained in the same manner as that of Example 5, except that the weight ratio of TEMPO-oxidized nanocellulose to nanosilver was changed to 5:5.

Test of Properties

The properties of the conductive films obtained in Examples 3-6 were tested by the following method.

1. Length and Diameter of TEMPO-Oxidized Nanocellulose

The lengths and the diameters of 100 strings of EMPO-oxidized nanocellulose were measured by a laser diffraction and scattering method, and the average values thereof were used as the length and the diameter of the TEMPO-oxidized nanocellulose, respectively.

2. Average Particle Diameter of Nanosilver

The diameters of 100 nanosilver particles were measured by a laser diffraction and scattering method, and the average value thereof was used as the diameter of the nanosilver particle.

2. Light Transmittance of Conductive Film

Measurement was performed at 560 nm with a spectrophotometer.

3. Heat Resistance of Conductive Film

The heat resistance of the conductive film indicates the temperature at which the conductive film was lost by 5 wt %.

4. Resistivity of Conductive Film

Measurement was performed by a four-probe method.

Results were summarized in the Table below.

|  | Example 3 | Example 4 | Example 5 | Example 6 |
|---|---|---|---|---|
| Weight ratio of nanosilver/oxidized nanocellulose | 2:8 | 3:7 | 4:6 | 5:5 |
| Diameter of nanosilver (nm) | 15 | 15 | 15 | 15 |
| Diameter of oxidized nanocellulose (nm) | 3 | 3 | 3 | 3 |
| Length of oxidized nanocellulose (μm) | 3 | 3 | 3 | 3 |
| Light transmittance (%) | 94% | 93% | 92.5% | 91% |
| Heat resistance (° C.) | 350 | 380 | 400 | 410 |
| Resistivity (μΩ · cm) | 36.2 | 27.0 | 26.3 | 25.1 |

As can be seen from the Table, the nanometal/oxidized nanocellulose composite conductive film has a good light transmittance (higher than about 90%) and a good heat resistance (greater than or equal to 350° C.). Furthermore, the heat resistance may be further improved by crosslinking (greater than or equal to 400° C.).

According to this disclosure, there may be provided a biomass-based conductive film, a production method thereof, and a display apparatus. The conductive film comprises nanometal as a filling material; and oxidized nanocellulose as a matrix material. A nanometal/oxidized nanocellulose composite conductive film has a good light transmittance (higher than about 90%) and a good heat resistance (which may be up to 400° C.), and may be used in flexible display. Furthermore, the oxidized nanocellulose is derived from lignin of plants in nature, and has a low cost and an environment-friendly production process, complying with the idea of sustainable development.

Obviously, various modifications and variations may be made to the Examples of this disclosure by the person skilled in the art without deviating from the spirit and the scope of this disclosure. Thus, if these modifications and variations of this disclosure are within the scope of the claims of this disclosure and equivalent techniques thereof, this disclosure also intends to encompass these modifications and variations.

What is claimed is:

1. A conductive film, comprising:
a film matrix formed from oxidized nanocellulose, and nanometal filled in the film matrix,
wherein the film matrix is oxidized nanocellulose crosslinked with bivalent or trivalent metal ions.

2. The conductive film according to claim 1, wherein the nanometal is uniformly dispersed in the film matrix.

3. The conductive film according to claim 1, wherein the bivalent or trivalent metal ions are selected from at least one of calcium ions, magnesium ions, aluminum ions, and trivalent iron ions.

4. The conductive film according to claim 1, wherein the nanometal is selected from at least one of nanosilver, nanocopper, and nanogold.

5. The conductive film according to claim 1, wherein the nanometal is selected from at least one of a nanometal particle and a nanometal wire, the nanometal particle has a particle diameter of 10 to 20 nm, and the nanometal wire has a diameter of 10 to 20 nm and a length of 100 to 200 nm.

6. The conductive film according to claim 1, wherein a weight ratio of the nanometal to the oxidized nanocellulose is 10:100 to 200:100.

7. The conductive film according to claim 1, wherein the oxidized nanocellulose has an aspect ratio of 200 to 2000 and a diameter of 1 to 10 nm.

8. The conductive film according to claim 1, wherein the conductive film has a thickness of 5 to 50 μm.

9. A method of producing a conductive film of claim 1, comprising:
mixing a dispersion of nanometal and a dispersion of oxidized nanocellulose to obtain a mixture, wherein the mixture contains sodium ions,
coating the mixture on a base substrate, and
drying the mixture coated on the base substrate to obtain a film, wherein the film contains oxidized nanocellulose connected to sodium ions,
immersing the film in a solution of bivalent or trivalent metal ions to substitute at least a part of the sodium ions connected to the oxidized nanocellulose with the bivalent or trivalent metal ions, to obtain the conductive film.

10. The method according to claim 9, wherein the base substrate is a polyethylene terephthalate or polymethyl methacrylate base substrate.

11. A display apparatus, comprising a conductive film of claim 1.

12. The display apparatus according to claim 11, wherein the conductive film is at least one of a cathode, an anode, a source electrode, a drain electrode, and a gate electrode.

13. The display apparatus according to claim 11, further comprising a polyethylene terephthalate or polymethyl methacrylate base substrate in direct contact with the conductive film.

* * * * *